(12) United States Patent
Huang

(10) Patent No.: US 11,374,410 B2
(45) Date of Patent: *Jun. 28, 2022

(54) METHOD FOR CONTROLLING CURRENT AMOUNT FLOWING INTO CIRCUIT MODULE AND ASSOCIATED CHIP

(71) Applicant: Silicon Motion, Inc., Hsinchu County (TW)

(72) Inventor: Cheng-Kai Huang, Tainan (TW)

(73) Assignee: Silicon Motion, Inc., Hsinchu County (TW)

( * ) Notice: Subject to any disclaimer, the term of this patent is extended or adjusted under 35 U.S.C. 154(b) by 99 days.

This patent is subject to a terminal disclaimer.

(21) Appl. No.: 17/089,665

(22) Filed: Nov. 4, 2020

(65) Prior Publication Data
US 2021/0050724 A1 Feb. 18, 2021

Related U.S. Application Data

(63) Continuation of application No. 16/008,010, filed on Jun. 13, 2018, now Pat. No. 10,868,424.

(30) Foreign Application Priority Data

Nov. 9, 2017 (TW) .................................. 106138697

(51) Int. Cl.
*H02J 3/14* (2006.01)
*G01R 31/30* (2006.01)
*G05F 1/10* (2006.01)
*H02J 1/06* (2006.01)

(52) U.S. Cl.
CPC ............ *H02J 3/14* (2013.01); *G01R 31/3004* (2013.01); *G05F 1/10* (2013.01); *H02J 1/06* (2013.01)

(58) Field of Classification Search
CPC .......... H02J 3/14; H02J 1/06; G01R 31/3004; G05F 1/10
USPC .......................................................... 307/35
See application file for complete search history.

(56) References Cited

U.S. PATENT DOCUMENTS

| 6,246,222 | B1 | 6/2001 | Nilles |
| 2009/0009238 | A1 | 1/2009 | Ogata |
| 2009/0237854 | A1 | 9/2009 | Mok |
| 2011/0205680 | A1 | 8/2011 | Kidd |
| 2012/0030489 | A1 | 2/2012 | Patil |

(Continued)

FOREIGN PATENT DOCUMENTS

| CN | 101119068 A | 2/2008 |
| JP | 2000-134919 | 5/2000 |
| TW | 200307488 | 12/2003 |

(Continued)

*Primary Examiner* — Daniel Kessie
*Assistant Examiner* — Dru M Parries
(74) *Attorney, Agent, or Firm* — Winston Hsu

(57) ABSTRACT

The present invention provides a chip comprising a circuit module, a power switch and a detection and control circuit. The power switch is coupled between a supply voltage and the circuit module, and is used to selectively connect the supply voltage to the circuit module, and control a current amount flowing into the circuit module according to at least a control signal. The detection and control circuit is coupled to the power switch, and is used to detect a first signal generated by a first circuit positioned surrounding the circuit module, and compare the first signal with a second signal in a real-time manner to generate the control signal to adjust the current amount flowing into the circuit module.

11 Claims, 4 Drawing Sheets

(56) References Cited

U.S. PATENT DOCUMENTS

2015/0177796 A1 6/2015 Bose
2017/0214323 A1 7/2017 Lin

FOREIGN PATENT DOCUMENTS

| TW | 200818676 | | 4/2008 |
|---|---|---|---|
| TW | 201232981 | A1 | 8/2012 |
| TW | I489267 | B | 6/2015 |
| TW | 201535943 | A | 9/2015 |

METHOD FOR CONTROLLING CURRENT AMOUNT FLOWING INTO CIRCUIT MODULE AND ASSOCIATED CHIP

CROSS REFERENCE TO RELATED APPLICATIONS

This is a continuation of the co-pending U.S. application Ser. No. 16/008,010 (filed on 2018 Jun. 13). The entire content of the related applications is incorporated herein by reference.

BACKGROUND OF THE INVENTION

1. Field of the Invention

The present invention relates to a method of controlling the current amount flowing into a circuit module and related chips.

2. Description of the Prior Art

In a circuit design that considers low power consumption, a power switch is usually utilized to power off and power up the circuit module to achieve the goal of reducing leakage current consumption. However, when the power switch is turned on so that the circuit module enters into the power-on status from the power-off status, if the limit of the maximum transient current is not considered, it may lead to an excessively high voltage drop of the peripheral components of the circuit module, and result in function or timing problems for the peripheral components.

In order to solve the above-mentioned problem of excessive maximum transient current, the electronic design automation software can be utilized for analysis, and different power switch architectures can be utilized to sequentially increase the current amount flowing into the circuit module. However, the simulation result during the analysis phase does not accurately reflect problems during the actual operation of the chip. Therefore, the designed power switch architecture is not able to be dynamically adjusted according to the status of the chip, which may affect the efficiency of the circuit module when turning on the power.

SUMMARY OF THE INVENTION

It is therefore one of the objectives of the present invention to provide a method of controlling the current amount flowing into the circuit module, which can detect whether the circuit module will affect peripheral components during power-off to power-on in a real-time manner, and accordingly dynamically adjust the current amount flowing into the circuit module to achieve the best power efficiency without affecting the peripheral components.

According to a first aspect of the present invention, an exemplary chip is disclosed. The chip comprises: a circuit module, a power switch and a detection and control circuit. The power switch is coupled between a supply voltage and the circuit module, used to selectively connect the supply voltage to the circuit module, and control a current amount flowing into the circuit module according to at least a control signal. The detection and control circuit is coupled by the power switch, used to detect a first signal generated by a first circuit positioned surrounding the circuit module, and compare the first signal with a second signal in a real-time manner to determine a signal status of the first circuit, and generate the control signal to adjust the current amount flowing into the circuit module.

According to a second aspect of the present invention, an exemplary method for controlling a current amount flowing into a circuit module is disclosed The method comprises: detecting a first signal generated by at least a first circuit positioned surrounding the circuit module and comparing the first signal with a second signal to determine a signal status of the first circuit to Generate a control signal; and controlling the current amount flowing into the circuit module according to the control signal.

Briefly summarized, the method of controlling the current amount flowing into the circuit module and the related chip disclosed by the present invention detect whether the signal status of the peripheral components is abnormal in a real-time manner when the circuit module enters into the power-on status from the power-off status, and accordingly dynamically adjust the current amount flowing into the circuit module. Therefore, the present invention can improve both the functionality of the peripheral component and the power-on efficiency of the circuit module.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend point to distinguish between components that differ in name but not function. In the following description and in the claims, the terms "include" and "comprise" are used in an open-end pointed fashion, and thus should be interpreted to mean "include, but not limited to". Also, the term "couple" is intend pointed to mean either an indirect or direct electrical connection. Accordingly, if one device is coupled to another device, that connection can be through a direct electrical connection, or through an indirect electrical connection via other devices and connections.

Figure 1:
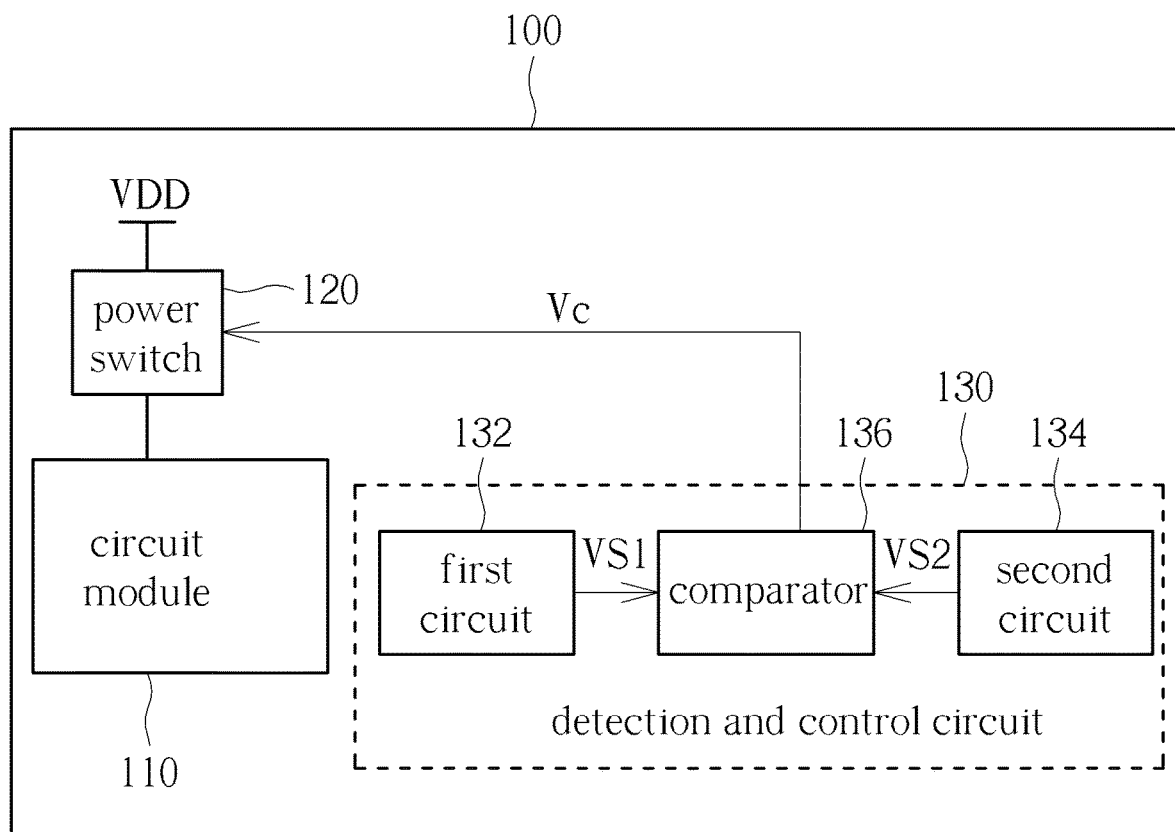
FIG. 1 is a schematic diagram of a chip according to an embodiment of the present invention.

FIG. 1 is a schematic diagram of a chip 100 according to an embodiment of the present invention. As shown in FIG. 1, the chip 100 comprises a circuit module 110, a power switch 120, and a detection and control circuit 130. The detection and control circuit 130 comprises a first circuit 132, a second circuit 134, and a comparator 136. In this embodiment, the circuit module 110 is an electrical circuit module capable of being switched. That is, the circuit module 110 selectively receives a supply voltage VDD through the power switch 120.

Figure 2:
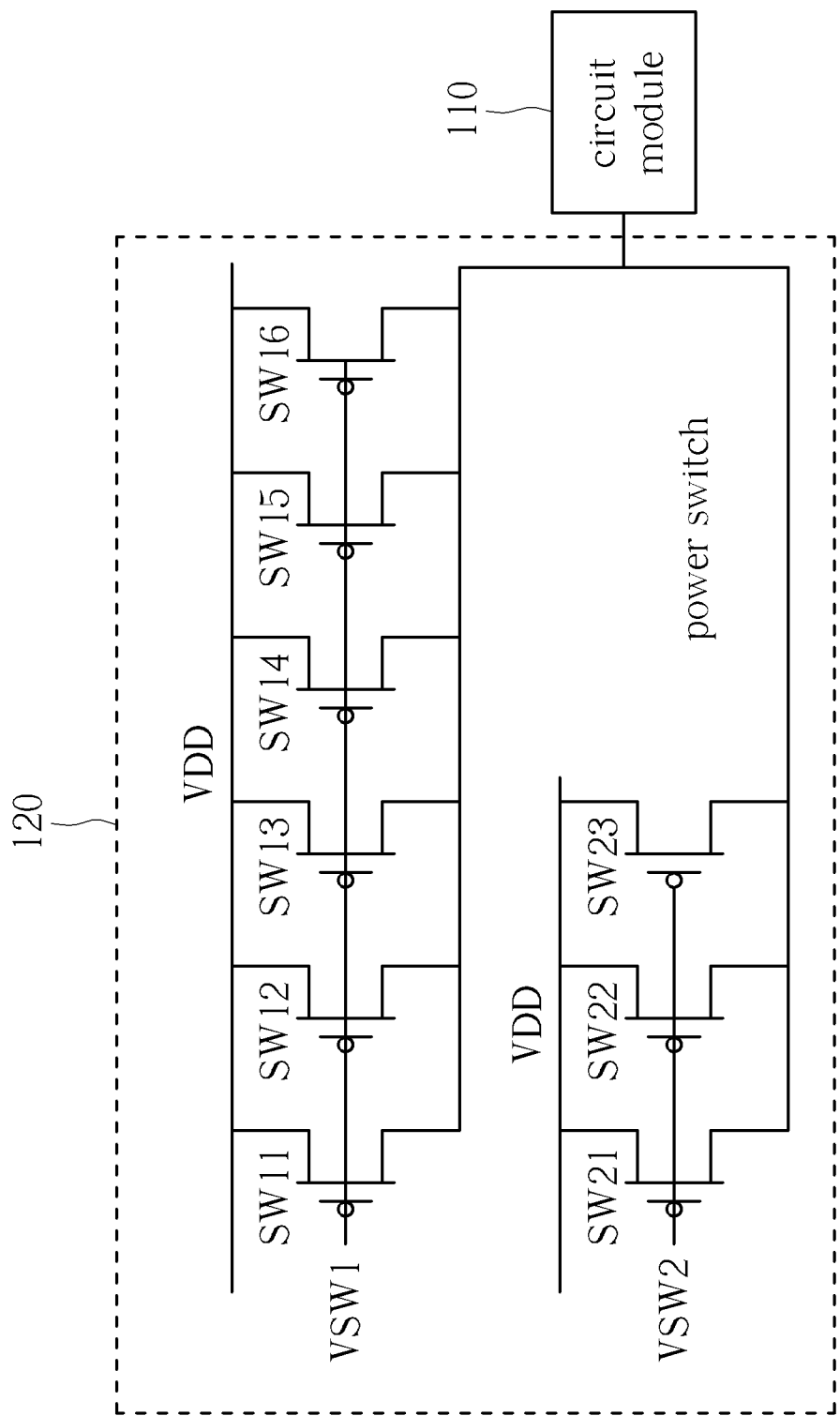
FIG. 2 is a schematic diagram of a power switch according to an embodiment of the present invention.

FIG. 2 is a schematic diagram of a power switch 120 according to an embodiment of the present invention. As shown in FIG. 2, the power switch 120 comprises two sets of switches, wherein the first set of switches comprises switches SW11-SW16 for turning on or off according to the level of a control signal VSW1; and the second set of switches comprises switches SW21-SW23 for turning on or off according to the level of a control signal VSW2. In the architecture shown in FIG. 2, when the first set of switches SW11-SW16 and the second set of switches SW21-SW23 are both turned off, the circuit module 110 is in the power-off status because the circuit module 110 is not able to receive the supply voltage VDD. When the first set of switches SW11-SW16 is turned off and the second set of switches SW21-SW23 are turned on, the circuit module 110 can receive the supply voltage VDD but only a small current amount flows from the terminal of the supply voltage VDD to the circuit module 110. When the first set of switches SW11-SW16 is turned on and the second set of switches SW21-SW23 is turned off, the circuit module 110 can receive the supply voltage VDD and have a higher current amount flows from the terminal of the supply voltage VDD into the circuit module 110. When the first set of switches SW11-SW16 and the second set of switches SW21-SW23 are both turned on, the highest current amount flows into the circuit module 110 from the terminal of the supply voltage VDD. It should be noted that the embodiment in FIG. 2 is only for illustration and is not intended as a limitation of the present invention. In other embodiments, the power switch 120 may have more sets of switches, and switch number of each set may also be the same or different. As long as the power switch 120 can control the circuit module 110 to have a plurality of kinds of different current amounts, related design changes should belong to the scope of the present invention.

As described in the prior art, when the power switch 120 is turned on to cause the circuit module 110 to enter the power-on status from the power-off status, the periphery components can be abnormal in function or timing due to momentary excessive current amount flowing into the circuit module 110. Therefore, in this embodiment, the detection and control circuit 130 is provided to dynamically detect the signal status of the peripheral components of the circuit module 110 to determine whether there is momentary excessive current amount problem, and generate a control signal Vc to adjust the current amount flowing from the terminal of the supply voltage VDD through the power switch 120 into the circuit module 110. That is, the control signals VSW1 and VSW2 shown in FIG. 2 can be changed according to the control signal Vc generated by the detection and control circuit 130.

In the detection and control circuit 130, the first circuit 132 is disposed at an edge of the circuit module 110 so that a generated first signal VS1 will be obviously affected by the transient current amount flowing into the circuit module 110. The second circuit 134 is disposed away from the circuit module 110 so that a second signal VS2 generated will not be affected by the transient current amount flowing into the circuit module 110. In this embodiment, the first signal VS1 generated by the first circuit 132 and the second signal VS2 generated by the second circuit 134 are the same signals. For example, the first circuit 132 and the second circuit 134 can be clock generating circuits having the same or similar architecture. The first signal VS1 and the second signal VS2 can be clock signals with the same frequency. In another embodiment, the first circuit 132 and the second circuit 134 can be linear feedback shift registers (LFSR). In this case, the first signal VS1 and the second signal VS2 are pseudo-random sequences. The comparator 136 compares the voltage levels of the first signal VS1 and the second signal VS2 to determine whether the first signal VS1 and the second signal VS2 are the same (that is, whether the voltage waveforms are the same) to generate the control signal Vc to the power switch 120, so as to adjust the current amount flowing into the circuit module 110.

In addition, in this embodiment, the detection and control circuit 130 is in an area that is never power-off in the chip 100. That is, as long as the chip 100 is connected to an external power supply, the detection and control circuit 130 can always receive the supply voltage VDD for related operations.

Specifically, when the circuit module 110 is required to enter the power-on status from the power-off status, a control circuit in the chip 100 will control the power switch 120 to generate the control signals VSW1 and VSW2 to turn on at least one of two sets of switches shown in FIG. 2. At this moment, since there is current starting to flow into the circuit module 110, the comparator 136 compares the first signal VS1 and the second signal VS2 to determine whether the first signal VS1 generated by the first circuit 132 disposed at the edge of the circuit module 110 is affected by the transient current of the power switch 120. If the comparison circuit 136 determines that the first signal VS1 generated by the first circuit 132 is affected by the transient current of the power switch 120, the comparison circuit 136 generates the control signal Vc to the power switch 120 to control/adjust the control signals VSW1 and VSW2 to turn off one set of the switches to reduce the current amount flowing into the circuit module 110. If the comparison circuit 136 determines that the first signal VS1 generated by the first circuit 132 is not affected by the transient current of the power switch 120, the comparison circuit 136 generates the control Signal Vc to the power switch 120 to control/adjust the control signals VSW1, VSW2 to turn on one set of the switches to increase the current amount flowing into the circuit module 110.

As described above, by detecting whether the signal of the peripheral component (i.e., the first circuit 132) is abnormal in a real-time manner during the circuit module 110 entering the power-on status from the power-off status, the current amount flowing into the circuit module 110 can be reduced as soon as possible to prevent the function of the peripheral components from being affected when the signal is abnormal. In addition, if the signal of the peripheral component (i.e., the first circuit 132) is detected as normal, the speed of turning on the power switch 120 can be accelerated to increase the current amount flowing into the circuit module 110 and improve the power-on efficiency. Therefore, this embodiment can improve both the functionality of the peripheral component and the power-on efficiency of the circuit module 110.

Figure 3:
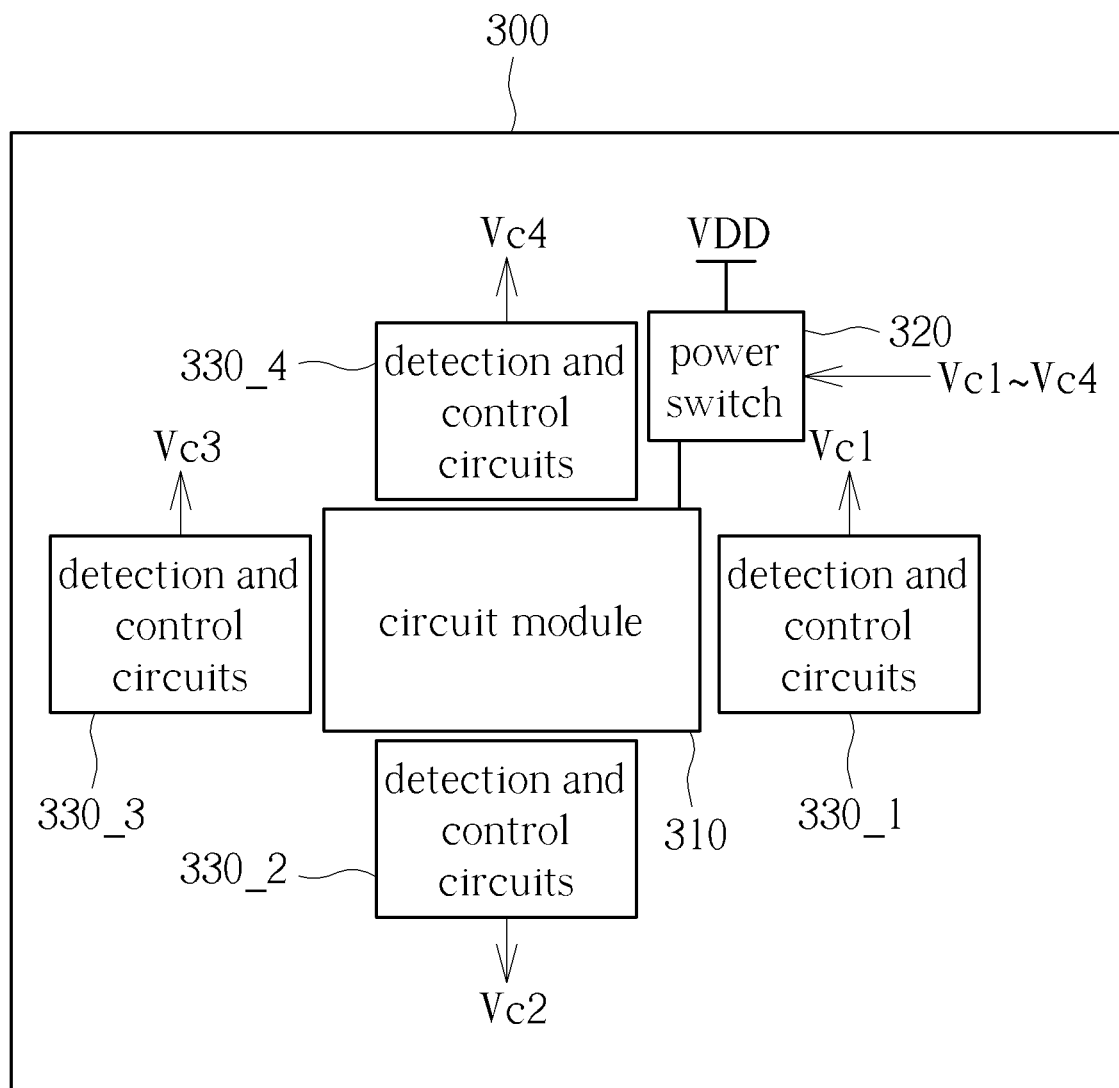
FIG. 3 is a schematic diagram of a chip according to another embodiment of the present invention.

In the embodiment shown in FIG. 1, the chip 100 only comprises one detection and control circuit 130. However, since the relative positions of the power switch 120 and the circuit module 110 may be different and the peripheral elements on each side of the circuit module 110 may be affected differently by the transient current, in other embodiments of the present invention, the chip 100 can comprise a plurality of detection and control circuits to determine more accurately the influence of the transient current of the circuit module 110 on the peripheral components. Please refer to FIG. 3. FIG. 3 is a schematic diagram of a chip 300 according to another embodiment of the present invention. As shown in FIG. 3, the chip 300 comprises a circuit module 310, a power switch 320, and four detection and control circuits 330_1-330_4. In this embodiment, the circuit module 310 is a circuit module capable of being switched. That is, the circuit module 310 selectively receives a supply voltage VDD through the power switch 320.

In an embodiment, the detection and control circuits 330_1-330_4 are evenly distributed surrounding the circuit module 310. For example, the control circuit 330_1 shown in FIG. 3 is positioned at the right side of the circuit module 310, and the control circuit 330_2 is positioned at the lower side the circuit module 310, the control circuit 330_3 is positioned on the left side of the circuit module 310, and the control circuit 330_4 is positioned at the upper side the circuit module 310. The structure of each of the detecting and controlling circuits 330_1-330_4 is the same as that of the detecting and controlling circuit 130 shown in FIG. 1, and the power switch 320 can also be implemented by the power switch 120 shown in FIG. 2. Therefore, the related operations details will be omitted. In this embodiment, the detecting and controlling circuits 330_1-330_4 respectively determine whether the signals of the peripheral elements (for example, the first circuit 132 shown in FIG. 1) of the circuit module 310 are normal and respectively generate a plurality of control signals Vc1-Vc4 to the power switch 320 to adjust the current amount flowing into the circuit module 310. Specifically, when the power switch 320 is turned on and the circuit module 310 enters into the power-on status from the power-off status, if Vc1-Vc4 received by the power switch 320 indicates that any one of the detection and control circuits 330_1-330_4 detects a signal status abnormal in the peripheral circuits of the circuit module 310, the power switch 320 reduces the voltage flowing into the circuit module 310 to prevent the function of the peripheral components from being affected. In addition, if the Vc1-Vc4 received by the power switch 320 indicate the signals of the peripheral circuits of the circuit module 310 detected by each of the detecting and controlling circuits 330_1-330_4 are normal, the speed of turning on the power switch 120 can be accelerated to increase the current amount flowing into the circuit module 110 and improve the power-on efficiency.

Figure 4:
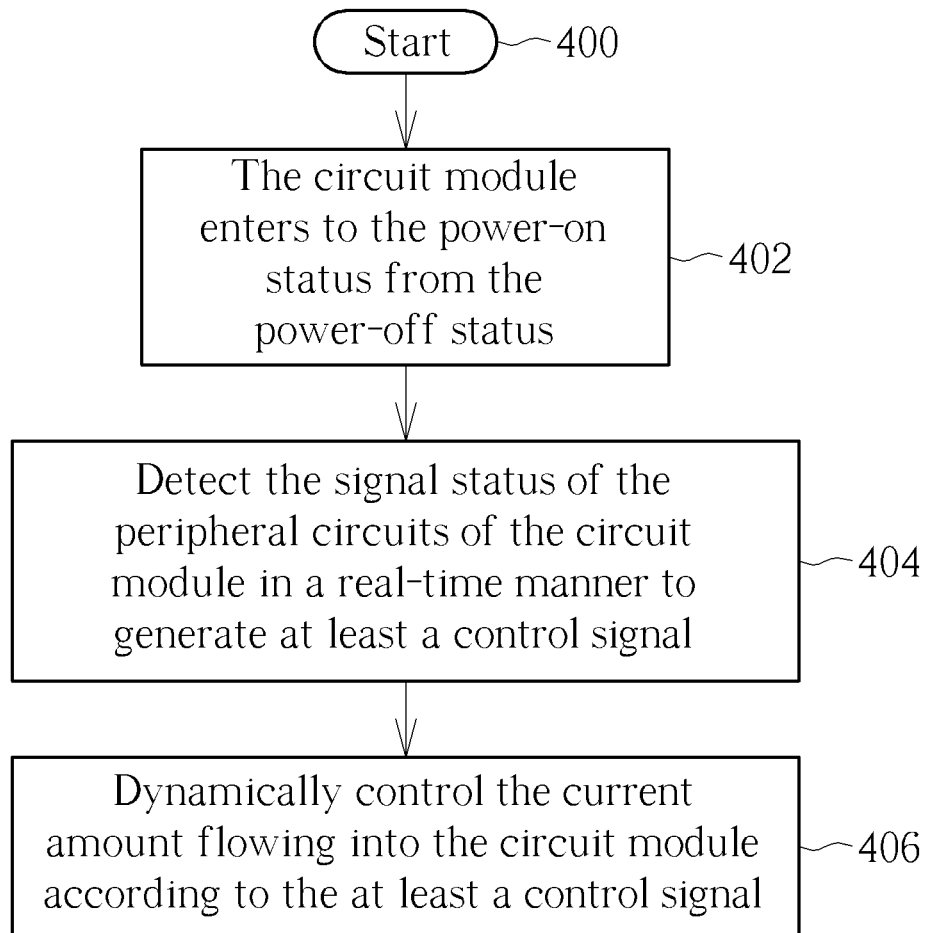
FIG. 4 is a flow chart of a method for controlling the current amount flowing into a circuit module according to an embodiment of the present invention.

FIG. 4 is a flow chart of a method for controlling the current amount flowing into a circuit module according to an embodiment of the present invention. Referring to FIGS. 1-4 and the above disclosure, the flow is as follows.

Step 400: Start.

Step 402: The circuit module enters into the power-on status from the power-off status.

Step 404: Detect the signal status of the peripheral circuits of the circuit module in a real-time manner to generate at least a control signal.

Step 406: Dynamically control the current amount flowing into the circuit module according to the at least a control signal.

Briefly summarized, the method of controlling the current amount flowing into the circuit module and the related chip disclosed by the present invention detect whether the signal status of the peripheral components is abnormal in a real-time manner when the circuit module enters into the power-on status from the power-off status, and accordingly dynamically adjust the current amount flowing into the circuit module. Therefore, the present invention can improve both the functionality of the peripheral component and the power-on efficiency of the circuit module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip, comprising:
a circuit module;
a power switch, coupled between a supply voltage and the circuit module, configured to selectively connect the supply voltage to the circuit module, and control a current amount flowing into the circuit module according to a control signal; and
a detection and control circuit, coupled to the power switch, configured to detect a first signal generated by a first circuit positioned surrounding the circuit module, and compare the first signal with a second signal in a real-time manner to determine a signal status of the first circuit, and generate the control signal to adjust the current amount flowing into the circuit module;
wherein the first signal and the second signal are ideally the same, and if the detection and control circuit detects that the first signal and the second signal are not the same, the detection and control circuit generates the control signal to reduce the current amount flowing into the circuit module;
wherein the first signal and the second signal are clock signals or pseudo-random sequences.

2. The chip of claim 1, wherein if the detection and control circuit determines that the first signal and the second signal are the same, then the detection and control circuit generates the control signal to increase the current amount flowing into the circuit module.

3. The chip of claim 1, wherein the detection and control circuit comprises:
the first circuit, for generating the first signal;
a second circuit, for generating the second signal; and
a comparison circuit, coupled to the first circuit and a second circuit, for comparing the first signal and the second signal to generate the control signal.

4. The chip of claim 3, wherein the first circuit and the second circuit are positioned in a region of the chip that is never power-off.

5. The chip of claim 4, wherein the first circuit is disposed at an edge of the circuit module, and a distance between the second circuit and the circuit module is greater than a distance between the first circuit and the circuit module.

6. The chip of claim 1, wherein the power switch comprises a plurality of switches, each of the switches is configured to selectively connect the supply voltage to the circuit module or not, and at least a portion of the switches are turned on when the power switch is turned on and the circuit module enters a power-on status from a power-off status; and if the detection and control circuit detects that the first signal and the second signal are not the same, the detection and control circuit generates the control signal to turn off part of the portion of the switches to reduce the current amount flowing into the circuit module.

7. The chip of claim 6, wherein if the detection and control circuit detects that the first signal and the second signal are the same, the detection and control circuit generates the control signal to turn on all of the switches to increase the current amount flowing into the circuit module.

8. A method of controlling the current amount flowing in a circuit module, comprising:
detecting a first signal generated by at least a first circuit positioned surrounding the circuit module and comparing the first signal with a second signal to determine a signal status of the first circuit, wherein the circuit module is connected to a supply voltage through a power switch and the power switch selectively provides the supply voltage to the circuit module, the first signal and the second signal are ideally the same, and the first signal and the second signal are clock signals or pseudo-random sequences; and if the signal status of the first circuit indicates that the first signal and the second signal are not the same, generating a control signal to reduce the current amount flowing into the circuit module.

9. The method of claim 8, further comprising:

if the signal status of the first circuit indicates that the first signal and the second signal are the same, generating the control signal to increase the current amount flowing into the circuit module.

10. The method of claim 8, wherein the power switch comprises a plurality of switches, each of the switches is configured to selectively connect the supply voltage to the circuit module or not, and at least a portion of the switches are turned on when the power switch is turned on and the circuit module enters a power-on status from a power-off status; and the step of if the signal status of the first circuit indicates that the first signal and the second signal are not the same, generating the control signal to reduce the current amount flowing into the circuit module comprises:

if the signal status of the first circuit indicates that the first signal and the second signal are not the same, generating the control signal to turn off part of the portion of the switches to reduce the current amount flowing into the circuit module.

11. The method of claim 10, further comprising:

if the signal status of the first circuit indicates that the first signal and the second signal are the same, generating the control signal to turn on all of the switches to increase the current amount flowing into the circuit module.

* * * * *